United States Patent [19]

Matsushita et al.

[11] Patent Number: 5,071,823
[45] Date of Patent: Dec. 10, 1991

[54] IMAGE-RECEIVING SHEET FOR TRANSFER RECORDING

[75] Inventors: Toshihiko Matsushita, Tokyo; Sadao Morishita, Ushiku, both of Japan

[73] Assignee: Mitsubishi Paper Mills Limited, Tokyo, Japan

[21] Appl. No.: 409,580

[22] Filed: Sep. 18, 1989

[30] Foreign Application Priority Data

Oct. 12, 1988 [JP] Japan ................................. 63-257631
Mar. 22, 1989 [JP] Japan ..................... 1-71013

[51] Int. Cl.$^5$ ...................... B41M 5/035; B41M 5/26
[52] U.S. Cl. ......................................... 503/227; 8/471; 428/195; 428/323; 428/327; 428/480; 428/913; 428/914; 430/138
[58] Field of Search ............... 428/195, 323, 327, 913, 428/914, 480; 430/138; 8/471; 503/227

[56] References Cited

U.S. PATENT DOCUMENTS 4,615,938  10/1986  Hotta et al. ..................... 428/323

OTHER PUBLICATIONS

Lopaque OP-84J, Technical brochure publ. by Rohm and Haas Japan K.K. (subsidiary of Rohm and Haas U.S.A.), pp. 1-8 (in Japanese language with portions in English language.
Design of Polymer Microspheres, Kobushi (Polymer), vol. 36, No. 9 (1987), pp. 648-651 (in Japanese language with portions in English language).
Ishikawa et al., "The Formation of 'Inverted' Core--Shell Latexes", J. of Polymer Science, vol. 21 (1983), pp. 147-154.
Kunihide Takarabe, "The Natures and Applications of Polymer Particles with Voids", Shikizai (Colorants), vol. 61[9] (1988), pp. 494-508 (in Japanese language).
Kunihide Takarabe, "The Natures and Applications of Polymer Particles with Voids", Shikizai (Colorants), vol. 61[9] (1988), pp. 494-504 (English translation).

Primary Examiner—Bruce H. Hess
Attorney, Agent, or Firm—Cushman, Darby & Cushman

[57] ABSTRACT

There is disclosed an image-receiving, transfer recording sheet excellent both in the preciseness of the image and the gradation reproducibility, characterized in that the heat insulating layer comprises macromolecular microspheres mainly made of hollow resin particles and/or heterogenous resin particles.

7 Claims, No Drawings

IMAGE-RECEIVING SHEET FOR TRANSFER RECORDING

BACKGROUND OF THE INVENTION

1. Field of the Invention

The present invention relates to image-receiving sheets for (i) thermal transfer recording such as thermal sublimation or thermal fusion transfer recording by use of thermal recording apparatus or devices including thermal printers and (ii) photosensitive, pressuresensitive transfer recording by use of microcapsules of the photo-setting type (type hardenable by light irradiation).

2. Description of the Prior Art

In recent years there have been energetically developed techniques of thermal fusion transfer recording to form transferred images on sheets of plain paper by using thermal printers, thermal facsimiles, or the like. This thermal transfer recording has been in extensive use recently in that recorders for this purpose, because of their simple mechanism, offer the advantages of easy maintenance, low prices, and low maintenance costs, that distinct and durable images can be recorded, and that color recording is possible relatively easily by using multicolor ink sheets.

Highly precise, color thermal transfer recording good in gradation reproducibility has been demanded particularly for applications to CAD/CAM systems, color copying machines, video printers, etc. Diversified improvements have been made of the recorders in thermal heads, of the thermal transfer films in the raw material, properties, layer constitution, etc. of heat fusible inks, and of the recording methods.

Image-receiving, transfer recording paper has also been improved in smoothness, oil absorbency, air permeability, etc.

For example, known techniques about imagereceiving transfer recording paper includes the following: Japanese Patent Application Kokai No. Sho. 60-255487 discloses that image-receiving paper exhibiting good gradation characteristics can be obtained by coating base paper with a heat fusible substance having a higher melting point than that of the heat fusible ink on the transfer film used.

Japanese Patent Application Kokai No. Sho. 57-182487 discloses that image-receiving sheets capable of recording steadily distinct images free of density unevenness can be obtained by providing sheets with image-receiving layers containing an oil-absorbing pigment which has an oil absorbency of at least 30 ml/ 100 g (measured in accordance with JIS K5101)

The thermal sublimation transfer recording technique using a thermal recording device such as a thermal printer comprises opposing an image-receiving sheet to a sublimation type of thermal transfer film prepared by applying a readily sublimable dye on a substrate such as paper or film, and transferring an image onto the image-receiving sheet from the transfer film by heating it with a thermal head or the like.

According to this technique, full-colored hard copies of high gradation quality can be obtained from readily sublimable dyes of yellow, magenta, cyan, and if necessary, black in color by heating them successively to transfer images.

As regards the prior art of thermal sublimation transfer recording, examples of known techniques include the following: Japanese Patent Application Kokai No. Sho. 57-107885 discloses a thermal recording sheet (image-receiving sheet) having on a substrate a coating layer containing a saturated polyester.

Japanese Patent Application Kokai No. Sho. 61-270192 discloses an image-receiving, thermal transfer recording sheet which has a microporous layer of thermoplastic resin or synthetic rubber between a substrate and an image-receiving layer. The thermoplastic resin is exemplified by a saturated polyester, polyurethane, vinyl chloride-vinyl acetate copolymer, and cellulose acetate propionate and the synthetic rubber is exemplified by styrene-butadiene rubber, isoprene rubber, and urethane rubbr. The micropores of the intermediate layer are formed by using a blowing agent or the like.

Japanese Patent Application Kokai No. Sho. 62-151393 discloses an image-receiving, thermal transfer recording sheet which has an elastomer layer between a supporting sheet and a dye-receicing layer. The elastomer is exemplified by butadiene rubber, isoprene rubber, nitrile rubber, styrene-butadiene rubber, chloroprene rubber, urethane rubber, silicone rubber, acrylic rubber, and natural rubber.

On the other hand, the photosensitive, pressure-sensitive transfer recording method using microcapsules of the photo-setting type is as follows: The recording system of this method comprises a transfer sheet having a support coated with microcapsules and an image-receiving sheet represented by plain paper. At least one of the shell and the inner phase that construct the microcapsule is made up of a substance which undergoes a change in properties when exposed to light, heat, or both light and heat. A latent image according to a pattern of such energy is formed on the transfer sheet by utilizing the above characteristic. The inner phase of the microcapsule contains a colorant which corresponds to an oil ink. The transfer sheet bearing the latent image is then combined with the image-receiving sheet, and subjected to pressure, heat, or both pressure and heat. Thereby the microcapsules (uncured) at the latent image areas are ruptured and the inner phase, i.e. the ink is transferred from the ruptured capsules to the image-receiving sheet, thus recording an image.

For example, Japanese Patent Application Kokai No. Sho. 62-39844 discloses a photosensitive, pressure-sensitive recording system for transferring images onto sheets of plain paper, the system comprising the exposure of microcapsules on a transfer sheet which enclose a photopolymerizable compound and a color dye or pigment to a pattern of light to form a latent image, that is, polymerizing the photopolymerizable compound at the exposed areas to harden the corresponding microcapsules, then combining the transfer sheet with a sheet of plain paper, and rupturing the unhardened microcapsules by applying pressure, to transfer the released colorant onto the plain paper sheet, thereby forming an image.

Japanese Patent Application Kokai No. Sho. 62-39845 discloses a photosensitive thermal transfer recording system which comprises combining a sheet of plain paper with a transfer sheet coated with microcapsules which are constructed of (i) shells made of a heat fusible substance and (ii) inner phases made of a color dye or pigment dissolved or dispersed in a photo-setting resin or in both a photo-setting resin and an organic solvent, and applying pressure and heat to the transfer sheet, thereby forming an image on the sheet of plain paper.

The above stated prior art involves various problems, examples of which are as follows:

As regards the thermal fusion transfer recording; a problem of the method of using image-receiving sheets having coats of heat fusible substance is that transferred images are lacking in long-term storage stability and particularly in heat stability; in the case of image-receiving sheets which have image-receiving layers containing an oil-absorbing pigment, the performance of transfer film depends on the melt viscosity of the heat fusible ink and on the oil absorbency of the pigment in the ink and there is still room for improvement in these properties for the purpose of providing highly precise transferred images.

As regards the thermal sublimation transfer recording; in the method of using an image-receiving sheet whick has on a substrate a monolayer coat containing a saturated polyester, the transferred image is lacking in preciseness or minuteness; further, in the method of using an image-receiving sheet which has an elastomer layer between a supporting sheet and a dye-receiving layer there is room for improving the transferred image in gradation reproducibility and in precision or minuteness.

In photosensitive, pressure-sensitive transfer recording, on the other hand, plain paper has so far been used for image-receiving sheets. However, images formed on sheets of plain paper are insufficient in qualities such as density (optical density), chroma, and resolution. In particular, multicolor transfer recording can provide no high-quality image since this recording is generally practiced by the method of transferring inks of different colors such as cyan, magenta, yellow with them combined together by superposing or overlaping.

SUMMARY OF THE INVENTION

As a result of intensive studies, the present inventors have found out image-receiving, transfer recording sheets on which highly precise images can be formed with good gradation reproducibility.

That is, the present invention involves an image-receiving, transfer recording sheet which has on a substrate a heat insulating layer comprising 100 parts by weight of macromolecular microspheres and 5-100 parts by weight of a binder, said microspheres consisting mainly of hollow resin particles and/or heterogeneous resin particles.

The resin of said hollow resin particles is selected from styrene family resins, acrylic resins, and styrene-acrylic compound copolymer resins. The resin of said heterogeneous resin particles is selected from an ethyl acrylate-styrene copolymer resin, butyl acrylate-styrene copolymer resin, and methyl methacrylate-styrene copolymer resin.

In thermal transfer recording as well as in photosensitive, pressure-sensitive transfer recording, image-receiving sheets of the present invention can provide highly precise color images with high gradation reproducibility and good transfer efficiency.

This is also true in the formation of monochromatic images. The present image-receiving sheets can also be used as recording media in ink-jet recording, wherein recording media need to have good ability to absorb inks.

DETAILED DESCRIPTION OF PREFERRED EMBODIMENTS

Thermal fusion transfer recording is first described wherein image-receiving sheets of the present invention are used. This recording is accomplished by superposing a thermal transfer film on an imagereceiving sheet of the present invention so that the heat fusible ink layer of the transfer film may contact with the heat insulating layer comprising macromolecular microspheres, of the image-receiving sheet, and heating the transfer film from the side opposite to the ink layer side with a thermal head. Upon applying thermal energy to the transfer film from the thermal head, the heat fusible ink melts and penetrates into voids present in the heat insulating layer of the imagereceiving sheet. Further, thermal energy from the thermal head is accumulated in the heat insulating layer since it has fine voids.

This permits reducing the thermal energy consumed in thermal transfer recording. That is, transfer recording becomes possible with a reduced amount of thermal energy applied. Moreover, transferred images with good gradation reproducibility can be obtained by stepwise application of thermal energy ranging from a low level to a high level. Records obtained are also of high precision.

Secondly, thermal sublimation transfer recording can be carried out according to the present invention by using a transfer film having a sublimable dye ink layer and an image-recieving, transfer recording sheet formed of a substrate overlaid successively with a heat insulating layer comprising macromolecular microspheres and with a dyeable layer. In this case, the transfer film is superposed on the image-receiving sheet so that the sublimable dye ink layer may contact with the dyeable layer, and the transfer film is heated from the side opposite to the ink layer side with a thermal head. Upon applying thermal energy to the transfer film from the thermal head, the sublimable dye is sublimed, transferred, and fixed on and in the dyeable layer. Heat from the thermal head is accumulated in the heat insulating layer since it has fine voids.

This also permits reducing the thermal energy consumed in thermal transfer recording. That is, transfer recording becomes possible with a reduced amount of thermal energy applied. Moreover, transferred images with good gradation reproducibility can be obtained by stepwise application of thermal energy ranging from a low level to a high level. Records obtained are also of high precision.

In photosensitive, pressure-sensitive transfer recording according to the present invention, transferred images can be obtained with good efficiency, since the dye- or pigment-containing oil enclosed in microcapsules is released by rupturing the microcapsules with pressure and readily penetrates into voids present in the heat insulating layer of the image-receiving sheet. Under certain circumstances, heat is applied jointly with pressure to microcapsules. In these cases, the heat accumulation in the heat insulating layer betters the heat efficiency similarly to the case of thermal transfer recording and lowers the viscosity of microcapsule contents, hence an increase in transfer efficiency being observed.

Hollow resin particles and/or heterogeneous resin particles, as macromolecular microspheres used in the insulating layer of the image-receiving, transfer recording sheet, are fitted for achieving objects of the present invention.

The hollow resin particle has a cavity inside and a diameter of submicrons to tens of microns. Since these particles have cavities inside, the coating layer of these particles on the substrate has a heat insulating effect due to the enclosed air. Interstices among particles of the coating layer have oil absorbing functions. Oil absorbing functions can also be given to the shells of hollow resin particles by altering the shell structure from non-porous to coarse-porous or microporous.

The heterogeneous resin particles are composite macromolecular particles produced by seed emulsion polymerization, each particle being composed of two or more different polymers and like a confetto, snow man, wild strawberry, or star ( ) in shape.

For example, composite particles of polymers A and B having such a shape can be produced by the emulsion polymerization of monomer B using polymer A particles as seeds in an emulsion prepared by emulsion polymerization. In this case, these polymers A and B, different in nature, undergo phase separation, forming heterogeneous particles.

Since heterogeneous particles having such a peculiar shape as mentioned above are bulky, their coatings on substrates have voids and hence good heat insulating characteristics. Further, interstices among these particles have oil-absorbing functions.

Suitable resins for constructing the hollow resin particles include; styrene family resins, e.g. polystyrene and poly-α-methylstyrene; acrylic resins, e.g. polymethyl methacrylate and polyethyl methacrylate; and styrene-acrylic compound copolymer resins.

Suitable resins for constructing the heterogeneous resin particles include, for example, an ethyl acrylate-styrene copolymer resin, butyl acrylatestyrene copolymer resin, and methyl methacrylate-styrene copolymer resin.

Diameters of these particles are generally up to 10 $\mu$m, preferably up to 5 $\mu$m, particularly preferably up to 3 $\mu$m.

The heat insulating layer of the image-recieving, transfer recording sheet according to the present invention consists mainly of a combination of macromolecular microspheres with a binder.

The mixing ratio of the macromolecular microspheres to the binder is 100 parts to 5-100 parts, preferably 100 parts to 10-50 parts, by weight in the aspect of the heat insulating and oil absorbing charactersitics of the heat insulating layer. Taking further into account the dusting of the coated paper on supercalendering in its production, said mixing ratio is particularly preferably 100 parts to 15-30 parts by weight.

For the purpose of making the oil absorbing function or the function of fixing the sublimable dye more effective in addition to the heat insulating function, an inorganic or organic pigment (spherical particles not hollow but solid) may be used in such an amount, jointly with the macromolecular microspheres and the binder, as not to impair the heat insulating function.

Examples of the inorganic pigment include clay, talc, calcium carbonate, calcium sulfate, barium sulfate, titanium oxide, zinc oxide, zinc sulfide, satin white, silicon oxide, basic magnesium carbonate, alumina, synthetic silica, calcium silicate, diatomaceous earth, and aluminum hydroxide. Examples of the organic pigment include powders of benzoguanamine resin, polyethylene resin, polystyrene resin, ureaformaldehyde resin, and polyamide resin.

Suitable binders for use in the present invention include water-soluble polymers, synthetic latexes, and resins soluble in organic solvents. The above water-soluble polymers include; denatured starches, e.g. oxidized starch, etherified starch, and dextrin; cellulose derivatives, e.g. carboxymethylcellulose and hydroxyethylcellulose; casein, gelatin, soybean protein, polyvinyl alcohol and derivatives thereof, maleic anhydride resin, and copolymers of maleic anhydride with at least one other monomer such as ethylene, styrene, isobutylene, or vinyl acetate. The above synthetic polymer latexes include; latexes of conjugated diene copolymers such as common styrene-butadiene copolymer and methyl methacrylate-butadiene copolymer; latexes of acrylic polymers such as acrylic ester polymers and methacrylic ester polymers; latexes of vinyl polymers such as ethylene-vinyl acetate copolymer; and latexes of products of modifying those various polymers with functional groups, e.g. a carboxy group, by treating with monomers having such functional groups. The above resins soluble in organic solvents include polyacrylonirile, polyvinyl chloride, polyvinyl acetate, melamine resin, phenolic resin, polyurethane, polyamide resin, and alkyd resin.

In the present invention, the dyeable layer of the image-receiving sheet may be formed from a linear saturated macromolecular polyester that is produced by polycondensation of a dibasic acid with a dihydric alcohol. A typical example of the polyester is polyethylene terephthalate that is produced by polycondensation of terephthalic acid with ethylene glycol. The dyeable layer may also be formed from a saturated macromolecular polyester produced by random copolymerization of a dibasic acid and a dihydric alcohol with one or more other dibasic acid or dihydric alcohol for the purpose of optimizing or bettering the crystallinity, melting point, solubility, or some other property of the polyester itself.

Other suitable polyesters for making the dyeable layer include polybutylene terephthalate and poly-1,4-cyclohexanedimethylene terephthalate. Those polyesters may be used in the form of solutions in organic solvents but are preferably used in the form of aqueous dispersions form the industrial productibility point of view. Alternatively, it is preferable to use a water-soluble polyester such as a copolyester of terephthalic acid-sulfonated terephthalic acid mixed carboxylic acids with ethylene glycol.

However, materials for the dyeable layer are not limited to saturated polyester resins; any other resin dyeable with sublimable dyes may be used alone or in combination with a saturated polyester.

Suitable sublimable dyes for use in the present invention are of sublimation temperatures ranging from 70° to 400° C., particularly from 50° to 250° C.

Such sublimable dyes include disperse dyes, e.g. disperse blue 20 (tradename: Duranol Blue 2G), disperse yellow 42 (tradename: Resulin Yellow GR), and disperse red 1 (tradename: Celiton Scarlet B) and other types of dyes, e.g. quinalizarin dyes, dispersible monoazo dyes, dispersible anthraquinone dyes, disperse nitrodiphenylamine dyes, and anthracene dyes.

As occasion demands, the material for the heat insulating layer may further contain suitable additives selected from dispersants, thickeners, fluidity modifiers, deforming agents, foam suppressor, release agents, colorants, antiseptic agents, pH modifiers or buffers, etc., unless impairing any favorable property of the heat insulating layer.

The substrate of the present inventive image-receiving sheet may be opaque, translucent, or transparent. Suitable material for the substrate include paper, synthetic paper, cloth, non-woven fabric, glass, metal, cellophane, wood, and synthetic resin film.

The coating method used in the present invention to form the heat insulating layer comprises applying the above state composition dispersed or dissolved in water or an organic solvent. Any of coaters may be used which include a blade coater roll coater, brush coater, curtain coater, champlex coater, bar coater, and gravure coater. The applied dispersion or solution can be dried by various means, e.g. a gas heater, electric heater, stem heater, and hot air heater, giving a coated sheet.

The coating weight for the heat insulating layer is about 1 to 60 g/m$^2$, prefrably about 2 to 40 g/m$^2$, on a dry basis. The necessary amount of coat may be supplied either by one coating operation or by lap coating operation.

Occasionally, image-receiving sheets produced by forming merely heat insulating layers on substrates are inferior in smoothness, providing low-quality images. Accordingly, coatings applied and dried as stated above may be smoothed in a supercalender, gloss calendar, or the like to provide better quality images.

The image-receiving, transfer recording sheet of the present invention has on a substrate a heat insulating layer comprising macromolecular microspheres among which intestices are present. Owing to this porous structure and the good heat insulating function, highly precise transferred images have been obtainable with good gradation reproducibility in thermal transfer recording and similar transferred images have been obtainable with good transfer efficiency in photosensitive, pressure-sensitive transfer recording.

The present invention is illustrated in more detail with reference to the following examples. In these examples, "parts" are all by weight.

PREPARATION OF THERMAL TRANSFER FILM

One side of a 6-μm thick polyester film was coated with a heat resistant layer and the opposite side of the polyester film was coated with a heat fusible ink having the following composition by hot-melt coating to give a coating thickness of 3.0 μm, thus giving a thermal transfer film.
Composition:
  Carbon black: 13 parts
  Synthetic carnauba wax: 40 parts
  Paraffin was (155° F.): 40 parts
  Ethylene-vinyl acetate 2 parts copolymer:
  Petroleum resin: 5 parts

PREPARATION OF PHOTOSENSITIVE, PRESSURE-SENSITIVE TRANSFER SHEET

Preparation of photo-setting type microcapsules enclosing a dye of cyan color: A solution was prepared by mixing 100 parts of a 10% aqueous solution of ethylene-maleic anhydride copolymer, 10 parts of urea, and 1 part of resorcinol with 200 parts of water, and was adjusted to pH 3.5 by adding an aqueous sodium hydroxide solution.

Then an oil-in-water type of emulsion (oil particle sizes 4-8 82 m) was prepared by dissolving 14.4 parts of a cyan dye "orazol Blue" in 165.6 parts of a photo-setting resin of the epoxyacrylate family (tradename: RIPOXY, supplied by Showa Kobunshi Co., Ltd.), adding 0.8 part of 2,2-dimethoxy-2-phenylacetophenone (tradename: Irgacure 651, supplied by CibaGeigy Corp.) to the resulting solution under shielding light, and dispersing the resulting mixture in the above prepared aqueous solution. Further 2.5 parts of a 37% aqueous formaldehyde solution was added to the emulsion, and the resulting mixture was stirred for 4 hours while keeping the liquid temperature at 55° C. and then the mixture was cooled to room temperature, thus completing microcapsulation.

Further, 30 parts of the obtained microcapsules were mixed with 20 parts of wheat starch, 10 parts of paraffin wax, and 10 parts of an SBR latex, and the mixture was applied on base paper of 50 g/m$^2$ basis weight by using a Meyer bar to prepare a photosensitive, pressure-sensitive transfer sheet.

EXAMPLE 1

A coating liquid having the following composition for heat insulating layers was applied on base paper of 50 g/m$^2$ by means an air-knife coater to give a coating weight of 10 g/m$^2$, and the coated paper was supercalendered to smooth the surface, thus preparing an image-receiving, transfer recording sheet.
Composition:
  Polyacrylate-polystyrene 100 parts copolymer (tradename: XMRP-100, supplied by Mitsui-Toatsu Chemicals Inc.):
  Ethylene-vinyl acetate 15 parts copolymer (tradename: OM-4000, supplied by Kuraray Co., Ltd.):
The above polyacrylate-polystyrene copolymer is in the form of heterogeneous resin particles of 1.0-μm particle size showing confetto-like shapes.

COMPARATIVE EXAMPLE 1

An image-receiving, thermal transfer recording sheet (tradename: TTR-T, supplid by Mitsubishi Paper Mills, Ltd.) were used as a sample.

EXAMPLES 2-13 AND COMPARATIVE EXAMPLES 2-4

In the same manner as in Example 1, imagereceiving, transfer recording sheets were prepared by using different kinds of macromolecular microspheres and binders as shown in Table 1.

Amounts of binder shown in Table 1 are expressed in parts by weight based on 100 parts by weight of macromolecular microspheres used. Groups of heterogeneous resin particles used in Examples 11-13 are all like confetti in shape. In Comparative Example 4, solid urea resin particles were used as macromolecular microspheres.

TABLE 1

| | Macromolecular microsphere | | | | | Binder | |
|---|---|---|---|---|---|---|---|
| | Particle form | Composition | Particle size (μm) | Tradename | Maker | Composition | Amount (part by wt.) |
| Example | | | | | | | |

TABLE 1-continued

| | Macromolecular microsphere | | | | | Binder | |
|---|---|---|---|---|---|---|---|
| | Particle form | Composition | Particle size (μm) | Tradename | Maker | Composition | Amount (part by wt.) |
| 2 | Hollow resin particles | Acrylate/styrene copolymer | 0.55 | Ropaque OP-84J | Rohm & Haas Co. | Polyvinyl alcohol | 30 |
| 3 | Hollow resin particles | Acrylate/styrene copolymer | 0.55 | Ropaque OP-84J | Rohm & Haas Co. | Polyvinyl alcohol | 15 |
| 4 | Hollow resin particles | Acrylate/styrene copolymer | 0.55 | Ropaque OP-84J | Rohm & Haas Co. | Ethylene-vinyl acetate copolymer | 10 |
| 5 | Hollow resin particles | Acrylate/styrene copolymer | 0.3–0.4 | VONCOAT PP-100 | Dainippon Ink and Chem. Ind. Co., Ltd. | Ethylene-vinyl acetate copolymer | 15 |
| 6 | Hollow resin particles | Acrylate/styrene copolymer | 0.3–0.4 | VONCOAT PP-100 | Dainippon Ink and Chem. Ind. Co., Ltd. | Ethylene-vinyl acetate copolymer | 5 |
| 7 | Hollow resin particles | Acrylate/styrene copolymer | 10–20 | VONCOAT PP-207S | Dainippon Ink and Chem. Ind. Co., Ltd. | Ethylene-vinyl acetate copolymer | 15 |
| 8 | Hollow resin particles | Acrylate/styrene copolymer | 10–20 | VONCOAT PP-207S | Dainippon Ink and Chem. Ind. Co., Ltd. | Ethylene-vinyl acetate copolymer | 50 |
| 9 | Hollow resin particle | Acrylate/styrene copolymer | 10–20 | VONCOAT PP-207S | Dainippon Ink and Chem. Ind. Co., Ltd. | Ethylene-vinyl acetate copolymer | 100 |
| 10 | Hollow resin particles | Resin of styrene family | 0.2–0.3 | VONCOAT PP-199 | Dainippon Ink and Chem. Ind. Co., Ltd. | Polyvinyl alcohol | 15 |
| 11 | Heterogeneous resin particles | Styrene/acrylate copolymer | 0.5 | XMRP-140 | Mitsui-Toatsu Chemicals Inc. | Ethylene-vinyl acetate copolymer | 15 |
| 12 | Heterogeneous resin particles | Styrene/acrylate copolymer | 0.5 | XMRP-140 | Mitsui Toatsu Chemicals Inc. | Ethylene-vinyl acetate copolymer | 50 |
| 13 | Heterogeneous resin particles | Styrene/acrylate copolymer | 1.0 | XMRP-160 | Mitsui Toatsu Chemicals Inc. | Ethylene-vinyl acetate copolymer | 5 |
| Comparative Example | | | | | | | |
| 2 | Hollow resin particles | Acrylate/styrene copolymer | 0.55 | Ropaque OP-84J | Rohm & Haas Co. | Ethylene-vinyl acetate copolymer | 4 |
| 3 | Heterogeneous resin particles | Styrene/acrylate copolymer | 0.5 | XMRP-140 | Mitsui Toatsu Chemicals Inc. | Ethylene-vinyl acetate copolymer | 110 |
| 4 | Solid resin particle | Urea resin | 0.2–0.4 | UF Filler | Mitsui Toatsu Chemicals Inc. | Ethylene-vinyl acetate copolymer | 15 |

EXAMPLE 14

In the same manner as in Example 1, an imagereceiving, transfer recording sheet was prepared by using the following materials:

Polyacrylate-polystyrene copolymer 100 parts (tradename: XMRP-100, supplied by Mitsui-Toatsu Chemicals Inc.):

Calcined kaolin (tradename: ANSILEX 20 parts supplid by Engelhard Co.):

Ethylene-vinyl acetate copolymer 24 parts (tradename: OM-4000, supplied by Kuraray Co., Ltd.):

COMPARATIVE EXAMPLE 5

Common plain paper (for Xerox use) was used as an image-receiving, transfer recording sheet.

EVALUATION

1. Thermal transfer recording

A part of the above prepared thermal transfer film was superposed on each of image-receiving, transfer recording sheets prepared in Examples 1–14 and Comparative Examples 1–4 so that the heat fusible ink layer of transfer film might contact with the heat insulating layer of image-receiving sheet. Performance characteristics of these recording systems were evaluated by the following test methods. Results of the evaluation are shown in Table 2.

(1) Gradation quality

Using a thermal-head printer supplied by Matsushita Denshi Buhin Co., Ltd., solid printing (ink was applied all over the surface of image-receiving sheet) was made with the applied thermal energy varied from 0.27 to 2.0 mJ.

A print showing a linear relationship between the optical density of ink transferred and fixed and the applied thermal energy is represented by ○, a print showing no such relationship is represented by X, and a print intermediate in said characteristic between the above two is represented by Δ.

(2) Preciseness

Using the same printer as in the above (1), halftone printing was made by applying a thermal energy of 0.27 mJ. A print good in the preciseness of fine lines transferred is represented by ○, a print bad in said preciseness is represented by X, and a print intermediate in the preciseness between the above two is represented by Δ.

(3) Adhesiveness

A mending tape (Scotch ® tape) was applied on the heat insulating layer of an image-receiving, transfer recording sheet sample and then peeled off. The surface of the heat insulating layer after this peeling was observed to examine whether a part or all of the layer was flaked or not, thereby evaluating the adhesiveness of the layer to the substrate.

2. Photosensitive, pressure-sensitive transfer recording

A part of the above prepared photosensitive, pressure-sensitive transfer sheet was superposed on each of image-receiving, transfer recording sheets of Examples 1–14 and Comparative Examples 1–4. The sheets superposed together were pressed through the gap between rubber rolls, and the following qualities of obtained images were evaluated. Results of the evaluation are shown in Table 2.

(1) Optical density of image

The optical density of each image of cyan color was measured with a reflection-type densitometer "Macbeth RD-918" (supplied by Macbeth Co.).

(2) Color of image

An image good in color is represented by ○, an image bad in color is represented by X, and an image intermediate in color quality between the above two is represented by Δ.

TABLE 2

| Property evaluated | Thermal transfer | | | Photosensitive, pressure-sensitive transfer | |
| --- | --- | --- | --- | --- | --- |
| | Gradation quality | Preciseness of image | Adhesiveness | Optical density of image | Color of image |
| Example | | | | | |
| 1 | ◯ | ◯ | ◯ | 0.86 | ◯ |
| 2 | ◯ | ◯ | ◯ | 0.89 | ◯ |
| 3 | ◯ | ◯ | ◯ | 0.91 | ◯ |
| 4 | ◯ | ◯ | ◯ | 0.89 | ◯ |
| 5 | ◯ | ◯ | ◯ | 0.91 | ◯ |
| 6 | ◯ | ◯ | Δ | 0.93 | ◯ |
| 7 | ◯ | ◯ | ◯ | 0.90 | ◯ |
| 8 | ◯ | ◯ | ◯ | 0.85 | ◯ |
| 9 | Δ | Δ | ◯ | 0.80 | ◯ |
| 10 | ◯ | ◯ | ◯ | 0.83 | Δ |
| 11 | ◯ | ◯ | ◯ | 0.92 | ◯ |
| 12 | ◯ | ◯ | ◯ | 0.89 | ◯ |
| 13 | ◯ | ◯ | ◯ | 0.94 | ◯ |
| 14 | ◯ | ◯ | ◯ | 0.88 | ◯ |
| Comparative Example | | | | | |
| 1 | X | Δ | ◯ | 0.65 | Δ |
| 2 | Δ | X | X | 0.88 | Δ |
| 3 | X | X | ◯ | 0.75 | Δ |
| 4 | X | X | ◯ | 0.61 | Δ |
| 5 | X | X | ◯ | 0.57 | X |

It can be seen from Table 2 that when the amount of binder (per 100 parts of macromolecular microspheres) is too large (comparative Example 3), the image obtained by thermal transfer recording is inferior in gradation quality and preciseness and when the amount of binder is too small (Comparative Example 2), the heat insulating layer is inferior in adhesiveness. In the photosensitive, pressuresensitive transfer recording, images obtained in Comparative Examples 3 and 4 are low in optical density and the image-receiving sheet of Comparative Example 2 forms a dense image but the heat insulating layer of the sheet is liable to flake.

PREPARATION OF THERMAL SUBLIMATION TRANSFER FILM

A heat resistant layer was formed by coating on one side of a 6-μm thick polyester film and a sublimable dye ink of the following composition was applied on the opposite side of the polyester film by using a gravure printer to give a coating weight of 2 g/m², thus preparing a thermal sublimation transfer film.
Composition:
Kayaset Blue-906 (dispersible, 10 parts sublimable dye supplied by Nippon Kayaku Co., Ltd.):
VYLON #290 (polyester resin 3 parts supplied by Toyobo Co., Ltd.):
Aerosil R-972 (hydrophobic 2 parts silia supplied by Nippon Aerosil Co., Ltd.):
Toluene: 65 parts
Methyl ethyl ketone: 20 parts

EXAMPLE 15

A coating liquid of the following composition was applied on base paper of 50 g/m² basis weight by using an air-knife coater to give a coating weight of 10 g/m² and the surface of the resulting coat was smoothed by supercalendering, thus forming an imagereceiving, transfer recording sheet having a heat insulating layer.
Compositions:
Polyacrylate-polystyrene copolymer 100 parts (tradename: XMRP-100, supplied by Mitsui-Toatu Chemicals Inc.):
Ethylene-vinyl acetate copolymer 15 parts (tradename: OM-4000, supplied by Kuraray Co., Ltd.):
The above polyacrylate-polystyrene copolymer is in the form of heterogeneous resin particles of 1.0-μm particle size having confetto-like shapes.

Then a coating liquid of the following composition for dyeable layers was applied on the heat insulating layer by using an air-knife coater to give a coating weight of 4 g/m², thus preparing an imagereceiving transfer recording sheet.
Composition:
VYLONAL MD-1200 (aqueous dispersion 100 parts of polyester resin supplied by Toyobo Co., Ltd.):
Snowtex C (colloidal silica 150 parts supplied by Nissan Chemicals Co., Ltd.):
Cellosol B-961 (ethylenebis- 100 parts stearoamide emulsion supplied by Chukyo Yushi Co., Ltd.):

COMPARATIVE EXAMPLE 6

An image-receiving, transfer recording sheet was prepared according to the procedure of Example 15 except that a dyeable layer was formed directly on base paper without forming any heat insulating layer.

EXAMPLES 16-24 AND COMPARATIVE EXAMPLE 7

Different image-receiving, transfer recording sheets were prepared according to the procedure of Example 15 but with macromolecular microspheres varied as shown in Table 3.

Amounts by weight of binder to 100 parts by weight of macromolecular microspheres are shown in Table 3. Heterogeneous resin particles used in Examples 22-24 have all confetto-like shapes. In Comparative Example 7 non-hollow, solid urea resin prticles were used.

TABLE 3

| | Macromolecular microsphere | | | | | Binder | Amount of binder (part by wt.) |
| --- | --- | --- | --- | --- | --- | --- | --- |
| | Particle shape | Composition | Particle size (μm) | Tradename | Maker | Composition | |
| Example | | | | | | | |
| 16 | Hollow resin particles | Acrylate/styrene copolymer | 0.55 | Ropaque OP-84J | Rohm & Haas Co. | Polyvinyl alcohol | 30 |
| 17 | Hollow resin particles | Acrylate/styrene copolymer | 0.55 | Ropaque OP-84J | Rohm & Haas Co. | Polyvinyl alcohol | 15 |
| 18 | Hollow resin particles | Acrylate/styrene copolymer | 0.55 | Ropaque OP-84J | Rohm & Haas Co. | Ethylene-vinyl acetate copolymer | 10 |
| 19 | Hollow resin particles | Acrylate/styrene copolymer | 10–20 | VONCOAT PP-207S | Dainippon Inc. and Chemical Ind. Co., Ltd. | Ethylene-vinyl acetate copolymer | 15 |
| 20 | Hollow resin particles | Acrylate/styrene copolymer | 10–20 | VONCOAT PP-207S | Dainippon Inc. and Chemical Ind. Co., Ltd. | Ethylene-vinyl acetate copolymer | 50 |
| 21 | Hollow resin particles | Styrene family resin | 0.2–0.3 | VONCOAT PP-199 | Dainippon Inc. and Chemical Ind. Co., Ltd. | Polyvinyl alcohol | 15 |
| 22 | Heterogeneous resin particles | Styrene/acrylate copolymer | 0.5 | XMRP-140 | Mitsui-Toatsu Chemicals Inc. | Ethylene-vinyl acetate copolymer | 15 |
| 23 | Heterogeneous resin particles | Styrene/acrylate copolymer | 0.5 | XMRP-140 | Mitsui-Toatsu Chemicals Inc. | Ethylene-vinyl acetate copolymer | 50 |
| 24 | Heterogeneous resin particles | Styrene/acrylate copolymer | 1.0 | XMRP-160 | Mitsui-Toatsu Chemicals Inc. | Ethylene-vinyl acetate copolymer | 5 |
| Comparative Example | | | | | | | |
| 7 | Solid resin particles | Urea resin | 0.2–0.4 | UF Filler | Mitsui-Toatsu Chemicals Inc. | Ethylene-vinyl acetate copolymer | 15 |

EXAMPLE 25

An image-receiving, transfer recording sheet was prepared according to the procedure of Example 15 using the following materials:

Polyacrylate-polystyrene copolymer 100 parts (tradename: XMRP-100, supplied by Mitsui-Toatsu Chemicals Inc.):

Calcined kaolin (tradename ANSILEX 20 parts supplied by Engelhard Co.):

Ethylene-vinyl acetate copolymer 24 parts (tradename: OM-4000, supplied by Kuraray Co., Ltd.):

EVALUATION

Thermal sublimation transfer recording

A part of the sublimation transfer film was superposed on each of image-receiving, transfer recording sheets prepared in Examples 15-25 and Comparative Examples 6 and 7, so that the sublimable dye ink side of transfer film might contact with the dyeable layer of image-receiving sheet. On these combinations, the gradation quality and preciseness of images were evaluated by the above stated test methods. Results of the evaluation are shown in Table 4.

TABLE 4

| Property evaluated | Sublimation transfer | |
| --- | --- | --- |
| | Gradation quality | Preciseness |
| Example | | |
| 15 | ○ | ○ |
| 16 | ○ | ○ |
| 17 | ○ | ○ |
| 18 | ○ | ○ |
| 19 | ○ | ○ |
| 20 | ○ | ○ |
| 21 | ○ | ○ |
| 22 | ○ | ○ |
| 23 | ○ | ○ |
| 24 | ○ | ○ |
| 25 | ○ | ○ |
| Comparative Example | | |
| 6 | X | X |
| 7 | X | Δ |

It can be seen from Table 4 that the imagereceiving sheets prepared in Examples 15-25 by using macromolecular microspheres, in thermal sublimation transfer recording, exhibited suficiently the effects of heat insulating layers laid under dyeable layers, whereby images could be obtained with good gradation quality and high preciseness.

In Comparative Example 6, however, the gradation quality and also the preciseness were worse.

In Comparative Example 7, wherein solid resin particles were used to form the heat insulating layer, the recorded image was inferior in gradation quality.

As is clear from the results shown above, the image receiving sheets for the thermal transfer recording and photosensitive, pressure-sensitive transfer recording according to the present invention are excellent in the gradation reproducibility with highly precise image.

What is claimed is:

1. An image-receiving, transfer recording sheet composed of a substrate and a porous heat insulating layer which, laid on the substrate, comprises 100 parts by weight of macromolecular microspheres and 5-100 parts by weight of a binder, said microspheres consisting mainly of hollow resin particles and/or heterogeneous resin particles.

2. The image-receiving, transfer recording sheet of claim 1, wherein the hollow resin particles are formed of a styrene resin, acrylic resin, or styrene-acrylic copolymer resin.

3. The image-receiving, transfer recording sheet of claim 1, wherein the heterogeneous resin particles are formed of an ethyl acrylate-styrene copolymer resin, butyl acrylate-styrene co-polymer resin, or methyl methacrylate-styrene copolymer resin.

4. The image-receiving, transfer recording sheet of claim 1, having a dyeable layer which is for thermal sublimation transfer recording.

5. The image-receiving, transfer recording sheet of claim 4, which has additionally a dyeable layer comprising a saturated polyester resin.

6. The image-receiving, transfer recording sheet of claim 1, which is for thermal fusion transfer recording.

7. The image-receiving, transfer recording sheet of claim 1, which is for photosensitive, pressuresensitive transfer recording.

* * * * *